United States Patent
Kogure

(10) Patent No.: US 10,505,702 B2
(45) Date of Patent: *Dec. 10, 2019

(54) TRANSMISSION/RECEPTION MODULE

(71) Applicant: Murata Manufacturing Co., Ltd., Kyoto (JP)

(72) Inventor: Takeshi Kogure, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/164,943

(22) Filed: Oct. 19, 2018

(65) Prior Publication Data

US 2019/0052449 A1 Feb. 14, 2019

Related U.S. Application Data

(63) Continuation of application No. 15/710,023, filed on Sep. 20, 2017, now Pat. No. 10,142,087.

(30) Foreign Application Priority Data

Sep. 21, 2016 (JP) .................................. 2016-184041

(51) Int. Cl.
*H04L 5/14* (2006.01)
*H03F 1/56* (2006.01)
(Continued)

(52) U.S. Cl.
CPC ............. *H04L 5/1461* (2013.01); *H03F 1/56* (2013.01); *H03F 1/565* (2013.01); *H03F 3/19* (2013.01);
(Continued)

(58) Field of Classification Search
None
See application file for complete search history.

(56) References Cited

U.S. PATENT DOCUMENTS 6,111,459 A * 8/2000 Nishijima ............... H03F 3/602
330/124 D
6,175,279 B1 1/2001 Ciccarelli et al.
(Continued)

FOREIGN PATENT DOCUMENTS

| JP | 2005-535245 A | 11/2005 |
|---|---|---|
| JP | 2010-246154 A | 10/2010 |
| JP | 2015-204623 A | 11/2015 |

*Primary Examiner* — Anh Vu H Ly
(74) *Attorney, Agent, or Firm* — Pearne & Gordon LLP

(57) ABSTRACT

Provided is a transmission/reception module that includes: a power amplifier that outputs a transmission signal to an input/output terminal; a low-noise amplifier that amplifies a reception signal input from the input/output terminal; a duplexer that isolates the transmission signal, which is output to the input/output terminal from the power amplifier via a transmission node and a common node, and the reception signal, which is input to the low-noise amplifier from the input/output terminal via the common node and a reception node, from each other; and a phase-shift circuit that is provided between an input node of the low-noise amplifier and the reception node of the duplexer, and that adjusts an impedance at the input node of the low-noise amplifier with respect to the transmission signal and the reception signal such that the gain of the transmission signal is smaller than the gain of the reception signal.

15 Claims, 8 Drawing Sheets

(51) Int. Cl.
*H03F 3/19* (2006.01)
*H03F 3/24* (2006.01)
*H03F 3/72* (2006.01)

(52) U.S. Cl.
CPC ............... *H03F 3/245* (2013.01); *H03F 3/72* (2013.01); *H03F 2200/171* (2013.01); *H03F 2200/222* (2013.01); *H03F 2200/294* (2013.01); *H03F 2200/387* (2013.01); *H03F 2200/451* (2013.01); *H03F 2203/7209* (2013.01)

(56) References Cited

U.S. PATENT DOCUMENTS

| | | |
|---|---|---|
| 6,498,926 B1 | 12/2002 | Ciccarelli et al. |
| 6,847,269 B2 | 1/2005 | Watanabe et al. |
| 7,323,945 B2 | 1/2008 | Cyr et al. |
| 7,508,898 B2 | 3/2009 | Cyr et al. |
| 7,580,727 B2 | 8/2009 | Boyle et al. |
| 10,142,087 B2 * | 11/2018 | Kogure ................. H04L 5/1461 370/328 |
| 2004/0185916 A1 | 9/2004 | Chang et al. |
| 2007/0290767 A1 * | 12/2007 | Ali-Ahmad ............. H03H 9/54 333/133 |
| 2008/0129411 A1 | 6/2008 | Beaudin et al. |
| 2009/0006677 A1 | 1/2009 | Rofougaran |
| 2009/0102552 A1 * | 4/2009 | Shiramizu ............... H03F 1/342 330/98 |
| 2010/0233973 A1 * | 9/2010 | Churan ............... H04B 7/18515 455/114.2 |
| 2011/0064004 A1 * | 3/2011 | Mikhemar ............... H04B 1/18 370/277 |
| 2011/0064005 A1 * | 3/2011 | Mikhemar ............... H04B 1/525 370/278 |
| 2014/0328222 A1 | 11/2014 | Mao et al. |
| 2014/0355728 A1 * | 12/2014 | Liao ........................ H04B 1/10 375/346 |
| 2015/0085710 A1 | 3/2015 | Yoon et al. |
| 2015/0236748 A1 * | 8/2015 | Nobbe .................... H04B 17/12 455/78 |
| 2016/0359521 A1 | 12/2016 | Zhou et al. |
| 2017/0146591 A1 * | 5/2017 | Nobbe ..................... H04B 1/18 370/328 |
| 2018/0102745 A1 * | 4/2018 | Ariumi ..................... H03F 1/26 370/328 |
| 2018/0164366 A1 * | 6/2018 | Nobbe ..................... H04B 1/48 370/328 |
| 2019/0036488 A1 * | 1/2019 | Nakajima ............... H04B 1/525 370/328 |

* cited by examiner 200  201

300

300

TRANSMISSION/RECEPTION MODULE

This application is a continuation of U.S. application Ser. No. 15/710,023 filed on Sep. 20, 2017, which claims priority from Japanese Patent Application No. 2016-184041 filed on Sep. 21, 2016. The content of these applications are incorporated herein by reference in their entirety.

BACKGROUND

The present disclosure relates to a transmission/reception module. FIG. 2 of Japanese Unexamined Patent Application Publication (Translation of PCT Application) No. 2005-535245 discloses a multimode wireless module that can handle different communication standards and frequency bands. The global system for mobile communications (GSM) (registered trademark), personal communications service (PCS), and digital cellular system (DCS) standards are used as the different communication standards. In a PCS signal transmission system of the multimode wireless module, a PCS signal output from a power amplifier is transmitted from an antenna after passing through a high pass filter. The high pass filter allows a PCS signal and a DCS signal to pass therethrough, but blocks a GSM signal. In a PCS signal reception system of the multimode wireless module, a DCS signal, between a PCS signal and a DCS signal, that has passed through the antenna and the high pass filter is blocked by a band pass filter. A PCS signal that has passed through the band pass filter is amplified by a low-noise amplifier. A phase-shift circuit, which is formed of a series capacitor element and a shunt inductor element, is provided between the high pass filter and the band pass filter with ¼ wavelength transmission lines interposed therebetween. The values of the series capacitor element and the shunt inductor element of the phase-shift circuit are selected such that the impedances of the ¼ wavelength transmission lines match the input impedance of the band pass filter. A DCS signal transmission system and a DCS signal reception signal system have the same configurations as the PCS signal transmission system and the PCS signal reception system, respectively.

However, a signal component of part of a transmission signal output from the power amplifier of the PCS/DCS signal transmission system may pass through the high pass filter and the band pass filter without necessarily being sufficiently attenuated and may be input to the low-noise amplifier of the PCS/DCS signal reception systems. Depending on the impedance at the input node of the low-noise amplifier with respect to the transmission signal, the gain of the transmission signal may exceed the gain of a reception signal, and there is a fear that the isolation characteristics of the module will be degraded.

BRIEF SUMMARY

Accordingly, the present disclosure improves the isolation characteristics of a transmission/reception module.

In order to solve the above-described issue, a transmission/reception module according to an embodiment of the present disclosure includes: (i) a power amplifier that outputs a transmission signal to an input/output terminal; (ii) a low-noise amplifier that amplifies a reception signal input from the input/output terminal; (iii) a duplexer that has a common node, a transmission node and a reception node, and that isolates the transmission signal, which is output to the input/output terminal from the power amplifier via the transmission node and the common node, and the reception signal, which is input to the low-noise amplifier from the input/output terminal via the common node and the reception node, from each other; and (iv) a phase-shift circuit that is provided between an input node of the low-noise amplifier and the reception node of the duplexer, and that adjusts an impedance at the input node of the low-noise amplifier with respect to the transmission signal and the reception signal such that a gain of the transmission signal is smaller than the gain of the reception signal.

The transmission/reception module according to the embodiment of the present disclosure can realize improved isolation characteristics.

Other features, elements, characteristics and advantages of the present disclosure will become more apparent from the following detailed description of embodiments of the present disclosure with reference to the attached drawings.

DETAILED DESCRIPTION

Figure 1:
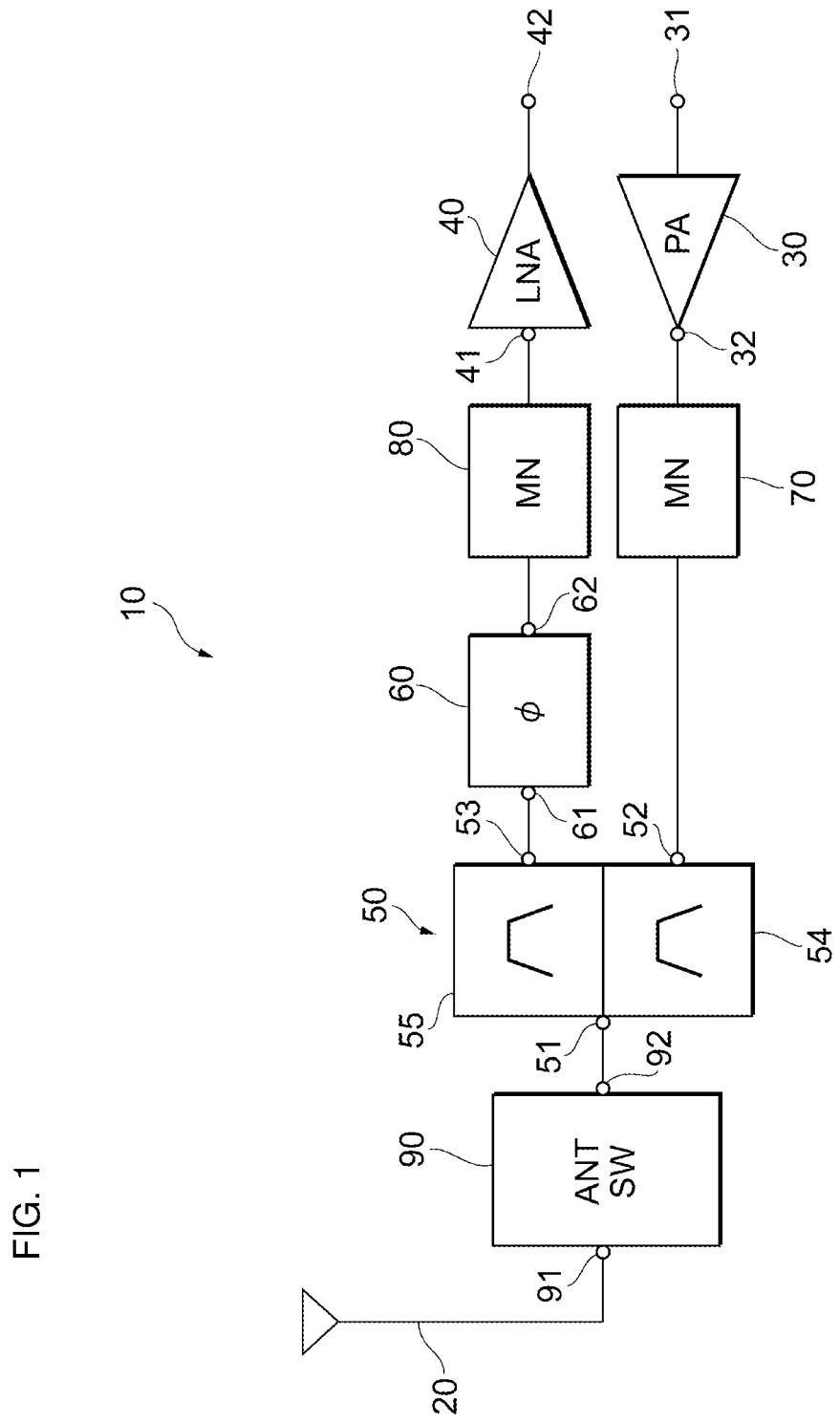
FIG. 1 is an explanatory diagram illustrating the circuit configuration of a transmission/reception module according to embodiment 1 of the present disclosure.

Hereafter, embodiments of the present disclosure will be described while referring to the drawings. Here, the same symbols denote the same circuit elements, and repeated description of the circuit elements is omitted.

FIG. 1 is an explanatory diagram illustrating the circuit configuration of a transmission/reception module 10 according to embodiment 1 of the present disclosure. The transmission/reception module 10 is a module that performs, in a mobile communication device such as a cellular phone, signal processing for transmitting and receiving radio frequency (RF) signals to and from a base station, and is also called a front end module. The transmission/reception module 10 includes a power amplifier (PA) 30, a low-noise amplifier (LNA) 40, a duplexer (splitter) 50 (first duplexer), a phase-shift circuit 60 (first phase-shift circuit), matching networks (MN) 70 and 80, and an antenna switch (ANT-SW) 90. The transmission/reception module 10 is connected to an antenna 20. The transmission/reception module 10 supports communication standards such as high-speed uplink packet access (HSUPA) and long term evolution (LTE), for example.

An RF signal is input to an input node 31 of the power amplifier 30 as a transmission signal. The RF signal is obtained by modulating a carrier wave in accordance with information that is superposed on a baseband signal that can be subjected to digital signal processing. The power amplifier 30 amplifies the transmission signal input to the input node 31 thereof, and outputs an amplified transmission signal from an output node 32 thereof. The transmission signal output from the output node 32 of the power amplifier 30 is wirelessly transmitted from the antenna 20 after passing through the duplexer 50 and the antenna switch 90. In contrast, an RF signal that is a reception signal received from the antenna 20 is input to an input node 41 of the low-noise amplifier 40 after passing through the antenna switch 90 and the duplexer 50. The low-noise amplifier 40 low-noise amplifies the reception signal input to the input node 41 thereof, and outputs an amplified reception signal from an output node 42 thereof. The reception signal output from the output node 42 of the low-noise amplifier 40 is demodulated into a baseband signal. The band of the transmission signal is 832 to 862 MHz, and the band of the reception signal is 791 to 821 MHz, for example.

The duplexer 50 includes a common node 51, a transmission node 52, a reception node 53, a transmission filter 54 and a reception filter 55. The common node 51 is connected to the antenna 20 via the antenna switch 90, and is also referred to as an antenna node. The transmission node 52 is connected to the power amplifier 30 via the matching network 70, and is also referred to as a transmission signal input node. The reception node 53 is connected to the low-noise amplifier 40 via the matching network 80, and is also referred to as a reception signal output node. The transmission filter 54 allows a transmission signal output to the antenna 20 from the power amplifier 30 via the transmission node 52 and the common node 51 to pass therethrough with low loss, but blocks a reception signal. The reception filter 55 allows a reception signal input to the low-noise amplifier 40 from the antenna 20 via the common node 51 and the reception node 53 to pass therethrough with low loss, but blocks a transmission signal. Thus, the duplexer 50 isolates a transmission signal output to the antenna 20 from the power amplifier 30 via the transmission node 52 and the common node 51, and a reception signal input to the low-noise amplifier 40 from the antenna 20 via the common node 51 and the reception node 53 from each other. The transmission filter 54 and the reception filter 55 are surface acoustic wave resonators, for example. The matching network 70 matches impedances between the output node 32 of the power amplifier 30 and the transmission node 52 of the duplexer 50. The matching network 80 matches impedances between the input node 41 of the low-noise amplifier 40 and the reception node 53 of the duplexer 50.

The antenna switch 90 includes a node 91 that is connected to the antenna 20, and a node 92 that is connected to the common node 51 of the duplexer 50. The antenna switch 90 selectively establishes paths for a transmission signal and a reception signal between the nodes 91 and 92. Here, the node 91 functions as an output terminal that outputs a transmission signal, and simultaneously functions as an input terminal that inputs a reception signal. Therefore, the node 91 functions as an input/output terminal for a transmission signal and a reception signal. The same also applies to the node 91 illustrated in FIG. 13.

Figure 2:
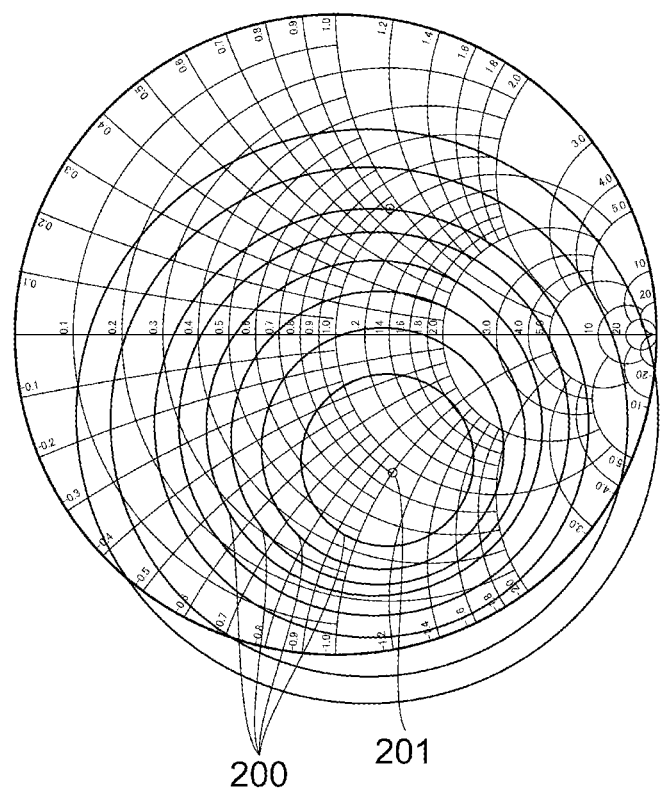
FIG. 2 is an explanatory diagram illustrating the gain circle on a Smith chart at the input node of a low-noise amplifier.
Figure 3:
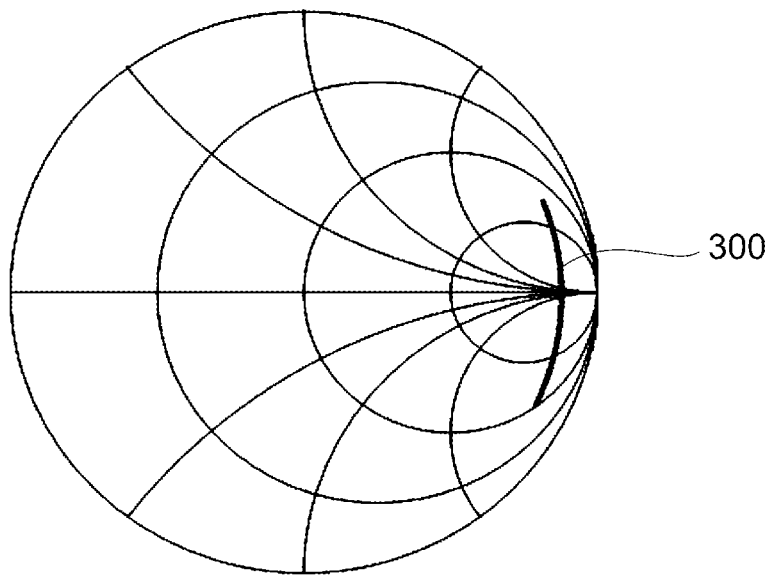
FIG. 3 is an explanatory diagram illustrating the impedance on a Smith chart with respect to a transmission signal at the input node of the low-noise amplifier in the case where a phase-shift circuit is not provided between the reception node of a duplexer and the input node of the low-noise amplifier.
Figure 4:
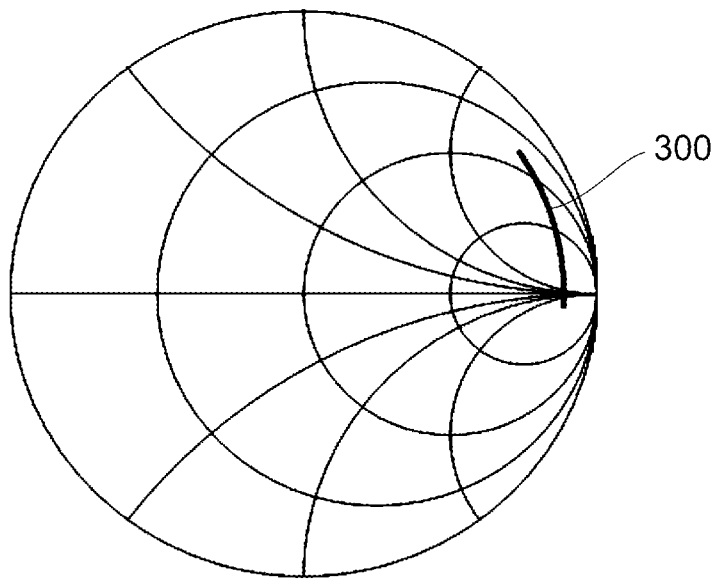
FIG. 4 is an explanatory diagram illustrating the impedance on a Smith chart with respect to a transmission signal at the input node of the low-noise amplifier in the case where a phase-shift circuit is provided between the reception node of the duplexer and the input node of the low-noise amplifier.
Figure 5:
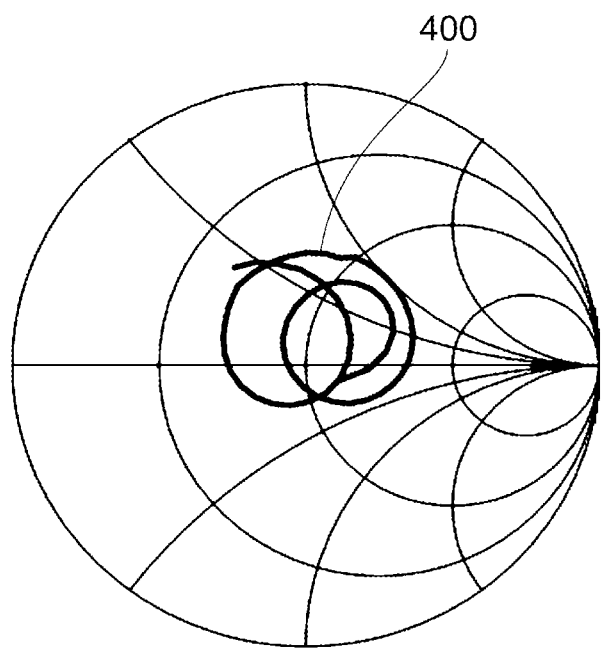
FIG. 5 is an explanatory diagram illustrating the impedance on a Smith chart with respect to a reception signal at the input node of a low-noise amplifier in the case where a phase-shift circuit is not provided between the reception node of a duplexer and the input node of the low-noise amplifier.
Figure 6:
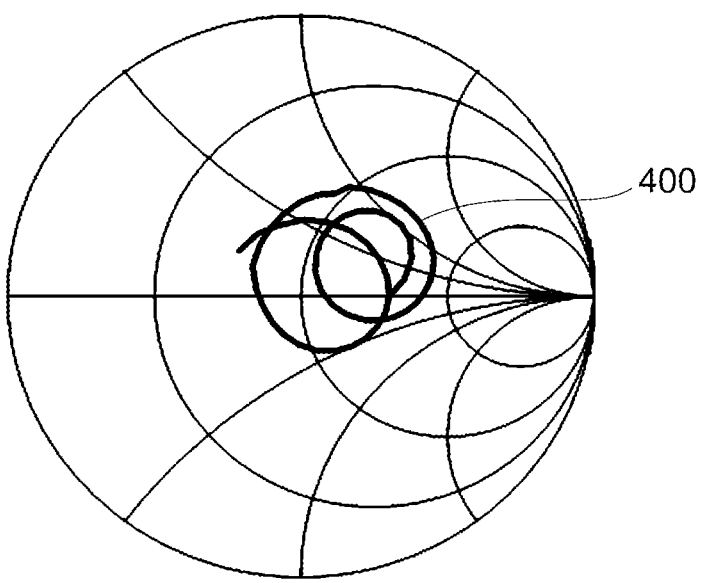
FIG. 6 is an explanatory diagram illustrating the impedance on a Smith chart with respect to a reception signal at the input node of a low-noise amplifier in the case where a phase-shift circuit is provided between the reception node of the duplexer and the input node of the low-noise amplifier.

An input node 61 of the phase-shift circuit 60 is connected to the reception node 53 of the duplexer 50. An output node 62 of the phase-shift circuit 60 is connected to the input node 41 of the low-noise amplifier 40 via the matching network 80. The phase-shift circuit 60 adjusts the impedance at the input node 41 of the low-noise amplifier 40 (or at the output node 62 of the phase-shift circuit 60) with respect to a transmission signal and a reception signal such that the gain of the transmission signal is smaller than the gain of the reception signal. The method of adjusting the impedance at the input node 41 of the low-noise amplifier 40 with respect to a transmission signal and a reception signal by using the phase-shift circuit 60 such that the gain of the transmission signal is smaller than the gain of the reception signal will be described while referring to FIGS. 2 to 7. FIG. 2 illustrates a gain circle 200 on a Smith chart at the input node 41 of the low-noise amplifier 40. The symbol 201 in FIG. 2 indicates the apex of the gain circle 200, and the gain of a signal is maximum when the impedance with respect to the signal at the input node 41 of the low-noise amplifier 40 coincides with the point indicated by the symbol 201. FIG. 3 illustrates an input impedance 300 on a Smith chart with respect to a transmission signal at the input node 41 of the low-noise amplifier 40 in the case where the phase-shift circuit 60 is not provided between the reception node 53 of the duplexer 50 and the input node 41 of the low-noise amplifier 40. FIG. 4 illustrates the input impedance 300 on a Smith chart with respect to a transmission signal at the input node 41 of the low-noise amplifier 40 in the case where the phase-shift circuit 60 is provided between the reception node 53 of the duplexer 50 and the input node 41 of the low-noise amplifier 40. FIG. 5 illustrates an input impedance 400 on a Smith chart with respect to a reception signal at the input node 41 of the low-noise amplifier 40 in the case where the phase-shift circuit 60 is not provided between the reception node 53 of the duplexer 50 and the input node 41 of the low-noise amplifier 40. FIG. 6 illustrates the input impedance 400 on a Smith chart with respect to a reception signal at the input node 41 of the low-noise amplifier 40 in the case where the phase-shift circuit 60 is provided between the reception node 53 of the duplexer 50 and the input node 41 of the low-noise amplifier 40.

In the case where the isolation characteristics of the duplexer 50 are insufficient, a signal component of a transmission signal that has passed through the transmission filter 54 may pass through the reception filter 55 without necessarily being sufficiently attenuated and may be input to the low-noise amplifier 40. In such a case, for example, as illustrated in FIG. 3, the input impedance 300 with respect to the transmission signal at the input node 41 of the low-noise amplifier 40 may be located in a region of the Smith chart where the gain of the transmission signal is high. In this case, the input impedance 300 with respect to the transmission signal can be shifted to a region of the Smith chart where the gain of the transmission signal is low by using the phase-shift circuit 60. As a result, the gain of the transmission signal at the input node 41 of the low-noise amplifier 40 can be reduced. On the other hand, for example, as illustrated in FIG. 5, the input impedance 400 with respect to the reception signal at the input node 41 of the low-noise amplifier 40 may be located in a region of the Smith chart where the gain of the reception signal is high. In this case, the input impedance 400 with respect to the reception signal is maintained in the region of the Smith chart where the gain of the reception signal is high by using the phase-shift circuit 60. Therefore, the phase-shift circuit 60 causes the input impedance 300 with respect to the transmission signal to be shifted to the region of the Smith chart where the gain is low, and shifting of the input impedance 400 with respect to the reception signal from the region of the Smith chart is minimized. Thus, the gain of the reception signal in the pass band of the reception filter 55 can be maintained at a high level while reducing the gain of the transmission signal in the reception filter 55, and therefore, the isolation characteristics of the transmission/reception module 10 can be improved. The duplexer 50 and the phase-shift circuit 60 do not need to be formed separately from each other, and the phase-shift circuit 60 may be built into the duplexer 50.

Figure 7:
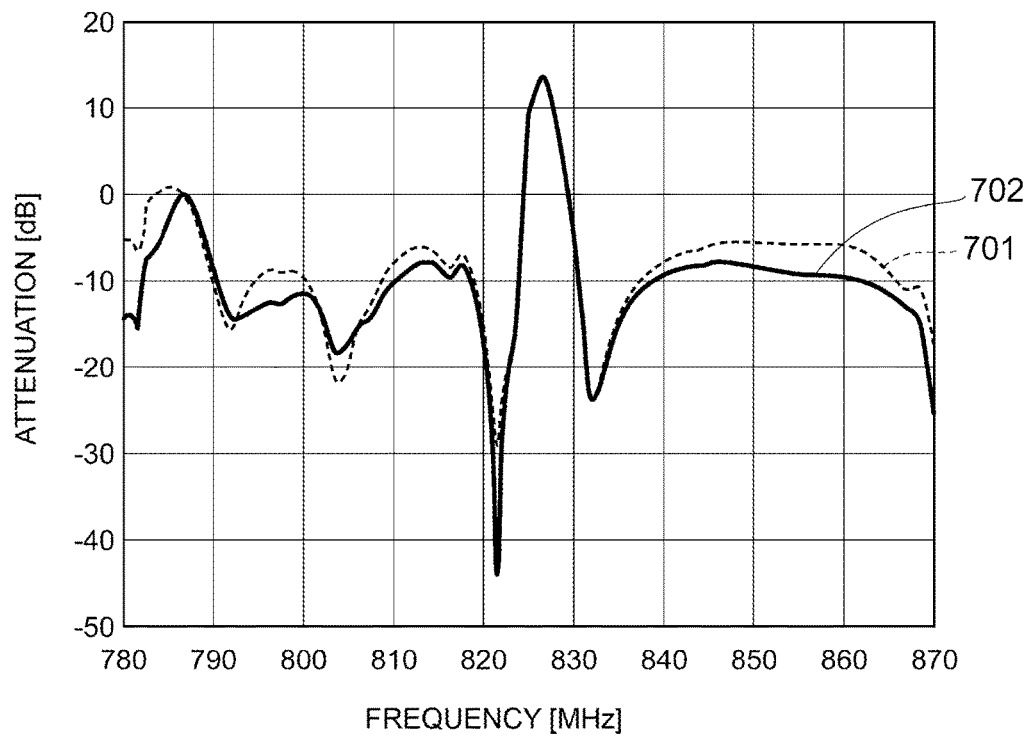
FIG. 7 illustrates simulation results indicating the isolation characteristics of a transmission/reception module.
Figure 8:
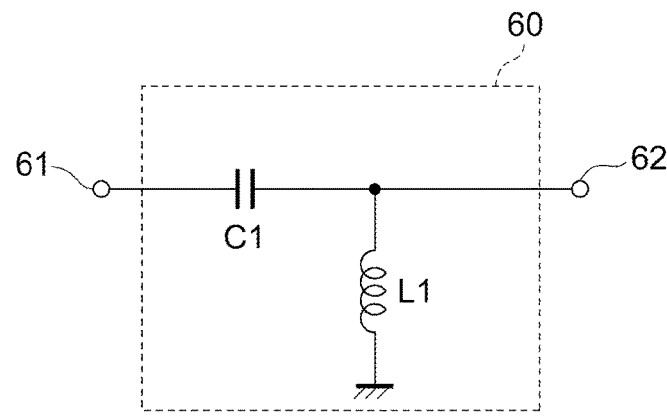
FIG. 8 is a circuit diagram illustrating a specific example of the circuit configuration of a phase-shift circuit.
Figure 9:
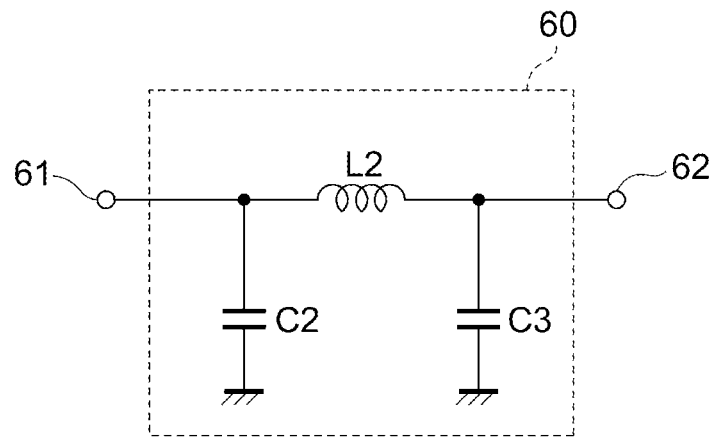
FIG. 9 is a circuit diagram illustrating a specific example of the circuit configuration of a phase-shift circuit.
Figure 10:
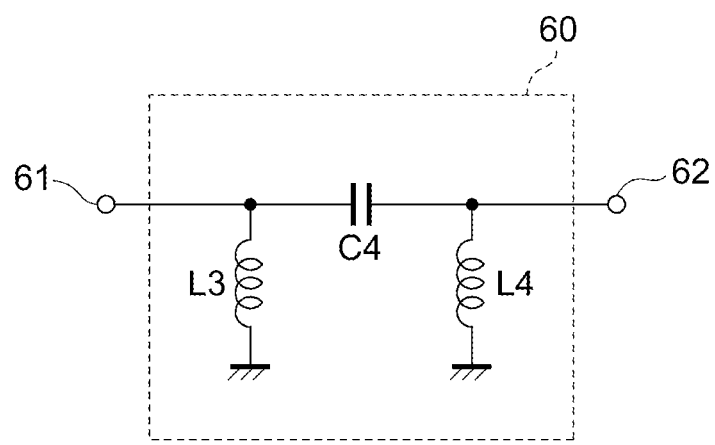
FIG. 10 is a circuit diagram illustrating a specific example of the circuit configuration of a phase-shift circuit.
Figure 11:
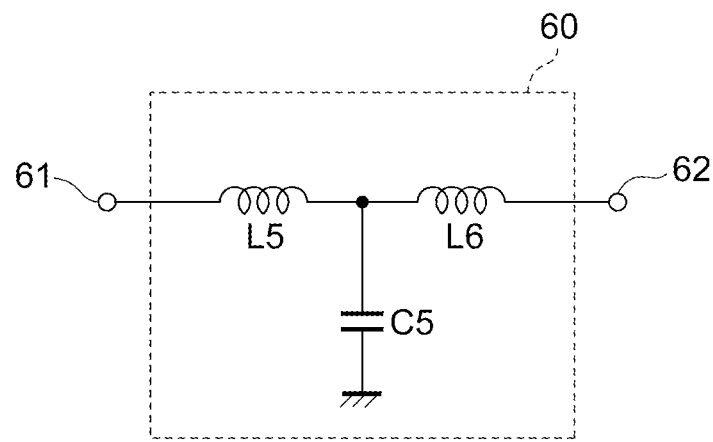
FIG. 11 is a circuit diagram illustrating a specific example of the circuit configuration of a phase-shift circuit.
Figure 12:
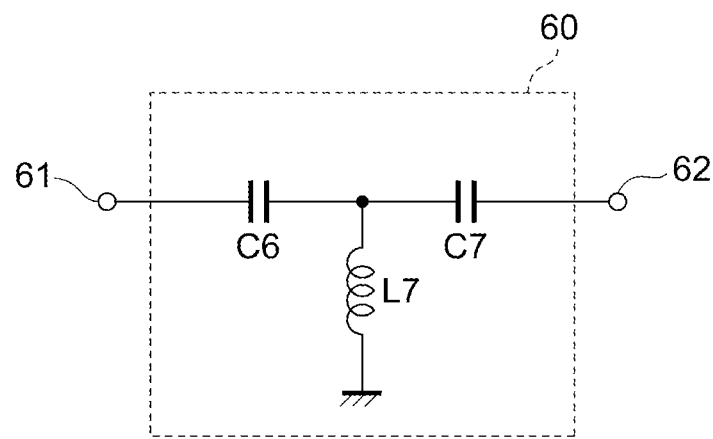
FIG. 12 is a circuit diagram illustrating a specific example of the circuit configuration of a phase-shift circuit.

FIG. 7 illustrates simulation results indicating the isolation characteristics of the transmission/reception module 10. A symbol 701 indicates the isolation characteristics when the phase-shift circuit 60 is not provided between the reception node 53 of the duplexer 50 and the input node 41 of the low-noise amplifier 40. A symbol 702 indicates the isolation characteristics when the phase-shift circuit 60 is provided between the reception node 53 of the duplexer 50 and the input node 41 of the low-noise amplifier 40. As illustrated in FIG. 7, it is confirmed that the isolation characteristics of the transmission/reception module 10 in the band of the transmission signal (832 to 862 MHz) are improved by the phase-shift circuit 60. This is because the gain of the transmission signal at the input node 41 of the low-noise amplifier 40 is reduced as a result of the phase-shift circuit 60 being provided between the reception node 53 of the duplexer 50 and the input node 41 of the low-noise amplifier 40.

The input impedance 300 with respect to the transmission signal at the input node 41 of the low-noise amplifier 40 is ideally shifted to the region of the Smith chart where the gain of the transmission signal is minimum in order to optimize the isolation characteristics of the transmission/reception module 10. In addition, at the same time, the input impedance 400 with respect to the reception signal is ideally shifted to the region of the Smith chart where the gain of the reception signal is maximum. However, it may be difficult to design the phase-shift circuit 60 in such a way as to both minimize the gain of the transmission signal and maximize the gain of the reception signal. Therefore, it is sufficient to the design the phase-shift circuit 60 so as to make the gain of the transmission signal smaller than the gain of the reception signal at the input node 41 of the low-noise amplifier 40. For example, even if the gain of the reception signal is slightly reduced from the region of the Smith chart where the gain is high, a slight reduction in the gain of the reception signal can be permitted provided that the gain of the transmission signal can be sufficiently reduced from the region of the Smith chart where the gain is high.

Along with the matching network 80, the phase-shift circuit 60 can also function as a matching network that performs impedance matching between the input node 41 of the low-noise amplifier 40 and the reception node 53 of the duplexer 50. Thus, the number of components can be reduced. The phase-shift circuit 60 can be formed of a combination of capacitor elements and inductor elements. FIGS. 8 to 12 illustrate specific examples of the circuit configuration of the phase-shift circuit 60. In the example circuit configuration illustrated in FIG. 8, the phase-shift circuit 60 includes a capacitor element C1, which is connected in series with a signal path between the input node 61 and the output node 62, and an inductor element L1, which is shunt connected between the signal path and ground. In the example circuit configuration illustrated in FIG. 9, the phase-shift circuit 60 includes an inductor element L2, which is connected in series with the signal path between the input node 61 and the output node 62, and capacitor elements C2 and C3, which are shunt connected between the signal path and ground. In the example circuit configuration illustrated in FIG. 10, the phase-shift circuit 60 includes a capacitor element C4, which is connected in series with the signal path between the input node 61 and the output node 62, and inductor elements L3 and L4, which are shunt connected between the signal path and ground. In the example circuit configuration illustrated in FIG. 11, the phase-shift circuit 60 includes inductor elements L5 and L6, which are connected in series with the signal path between the input node 61 and the output node 62, and a capacitor element C5, which is shunt connected between the signal path and ground. In the example circuit configuration illustrated in FIG. 12, the phase-shift circuit 60 includes capacitor elements C6 and C7, which are connected in series with the signal path between the input node 61 and the output node 62, and an inductor element L7, which is shunt connected between the signal path and ground.

Thus, the transmission/reception module 10 according to embodiment 1 can adjust the impedance at the input node 41 of the low-noise amplifier 40 with respect to the transmission signal and the reception signal using the phase-shift circuit 60 such that the gain of the transmission signal is smaller than the gain of the reception signal. As a result, the isolation characteristics of the transmission/reception module 10 can be improved. In addition, since the phase-shift circuit 60 is also able to function as a matching network that performs impedance matching between the input node 41 of the low-noise amplifier 40 and the reception node 53 of the duplexer 50, the phase-shift circuit 60 has an effect of reducing the number of components.

Figure 13:
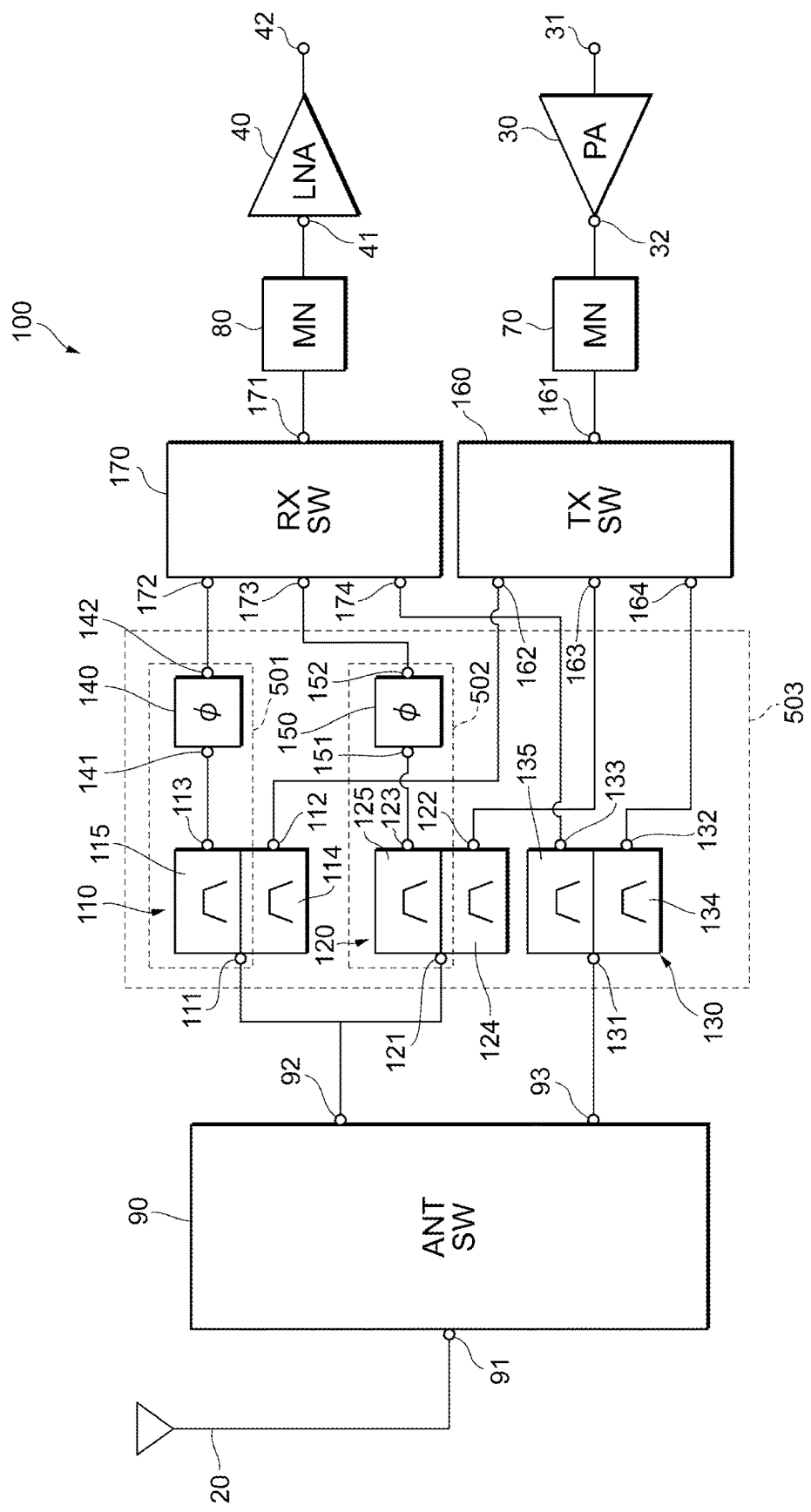
FIG. 13 is an explanatory diagram illustrating the circuit configuration of a transmission/reception module according to embodiment 2 of the present disclosure.

FIG. 13 is an explanatory diagram illustrating the circuit configuration of a transmission/reception module 100 according to embodiment 2 of the present disclosure. The transmission/reception module 100 differs from the transmission/reception module 10 according to embodiment 1 in that the transmission/reception module 100 is configured to be able to simultaneously receive a first reception signal and a second reception signal through carrier aggregation. The transmission/reception module 100 mainly includes a power amplifier (PA) 30, a low-noise amplifier (LNA) 40, a duplexer (splitter) 110 (first duplexer), a duplexer 120 (second duplexer), a duplexer 130 (third duplexer), a phase-shift circuit 140 (first phase-shift circuit), and a phase-shift circuit 150 (second phase-shift circuit).

RF signals are selectively input to an input node 31 of the power amplifier 30 as a first transmission signal, a second transmission signal and a third transmission signal. The power amplifier 30 amplifies the first transmission signal, the second transmission signal and the third transmission signal input to the input node 31 thereof, and outputs the amplified transmission signals from an output node 32 thereof. A transmission-signal-switching switch (TX-SW) 160 includes an input node 161, and output nodes 162, 163 and 164. The transmission-signal-switching switch 160 selectively outputs from the output node 162 thereof the first transmission signal input to the input node 161 thereof from the power amplifier 30. The transmission-signal-switching switch 160 selectively outputs from the output node 163 thereof the second transmission signal input to the input node 161 thereof from the power amplifier 30. The transmission-signal-switching switch 160 selectively outputs from the output node 164 thereof the third transmission signal input to the input node 161 thereof from the power amplifier 30.

The duplexer 110 includes a common node 111 (first common node), a transmission node 112 (first transmission node), a reception node 113 (first reception node), a transmission filter 114 (first transmission filter), and a reception filter 115 (first reception filter). The common node 111 is connected to anode 92 of the antenna switch (ANT-SW) 90. The transmission node 112 is connected to an output node 162 of the transmission-signal-switching switch 160. The reception node 113 is connected to an input node 172 of a reception-signal-switching switch (RX-SW) 170 via the phase-shift circuit 140. The transmission filter 114 has frequency characteristics in which the frequency band of the first transmission signal that is output to the antenna 20 from the power amplifier 30 via the transmission node 112 and the common node 111 is the pass band thereof, and in which the frequency band of the first reception signal is the stop band thereof. The reception filter 115 has frequency characteristics in which the frequency band of the first reception signal that is input to the low-noise amplifier 40 from the antenna 20 via the common node 111 and the reception node 113 is the pass band thereof, and in which the frequency band of the first transmission signal is the stop band thereof. The duplexer 110 isolates the first transmission signal output to the antenna 20 from the power amplifier 30 via the transmission node 112 and the common node 111, and the first reception signal input to the low-noise amplifier 40 from the antenna 20 via the common node 111 and the reception node 113 from each other. The transmission filter 114 and the reception filter 115 are surface acoustic wave resonators, for example.

The duplexer 120 includes a common node 121 (second common node), a transmission node 122 (second transmission node), a reception node 123 (second reception node), a transmission filter 124 (second transmission filter), and a reception filter 125 (second reception filter). The common node 121 is connected to the node 92 of the antenna switch 90. The transmission node 122 is connected to the output node 163 of the transmission-signal-switching switch 160. The reception node 123 is connected to an input node 173 of the reception-signal-switching switch 170 via the phase-shift circuit 150. The transmission filter 124 has frequency characteristics in which the frequency band of the second transmission signal that is output to the antenna 20 from the power amplifier 30 via the transmission node 122 and the common node 121 is the pass band thereof, and in which the frequency band of the second reception signal is the stop band thereof. The reception filter 125 has frequency characteristics in which the frequency band of the second reception signal that is input to the low-noise amplifier 40 from the antenna 20 via the common node 121 and the reception node 123 is the pass band thereof, and in which the frequency band of the second transmission signal is the stop band thereof. The duplexer 120 isolates the second transmission signal output to the antenna 20 from the power amplifier 30 via the transmission node 122 and the common node 121, and the second reception signal input to the low-noise amplifier 40 from the antenna 20 via the common node 121 and the reception node 123 from each other. The transmission filter 124 and the reception filter 125 are surface acoustic wave resonators, for example.

The duplexer 130 includes a common node 131 (third common node), a transmission node 132 (third transmission node), a reception node 133 (third reception node), a transmission filter 134 (third transmission filter), and a reception filter 135 (third reception filter). The common node 131 is connected to a node 93 of the antenna switch 90. The transmission node 132 is connected to the output node 164 of the transmission-signal-switching switch 160. The reception node 133 is connected to an input node 174 of the reception-signal-switching switch 170. The transmission filter 134 has frequency characteristics in which the frequency band of the third transmission signal that is output to the antenna 20 from the power amplifier 30 via the transmission node 132 and the common node 131 is the pass band thereof, and in which the frequency band of the third reception signal is the stop band thereof. The reception filter 135 has frequency characteristics in which the frequency band of the third reception signal that is input to the low-noise amplifier 40 from the antenna 20 via the common node 131 and the reception node 133 is the pass band thereof, and in which the frequency band of the third transmission signal is the stop band thereof. The duplexer 130 isolates the third transmission signal output to the antenna 20 from the power amplifier 30 via the transmission node 132 and the common node 131, and the third reception signal input to the low-noise amplifier 40 from the antenna 20 via the common node 131 and the reception node 133 from each other. The transmission filter 134 and the reception filter 135 are surface acoustic wave resonators, for example.

The reception-signal-switching switch 170 includes the input nodes 172, 173 and 174, and an output node 171. The reception-signal-switching switch 170 selectively outputs the first reception signal input to the input node 172 thereof from the duplexer 110 from the output node 171 thereof. The reception-signal-switching switch 170 selectively outputs the second reception signal input to the input node 173 thereof from the duplexer 120 from the output node 171 thereof. The reception-signal-switching switch 170 selectively outputs the third reception signal input to the input node 174 thereof from the duplexer 130 from the output node 171 thereof. The reception-signal-switching switch 170 can simultaneously output the first reception signal and the second reception signal from the output node 171 via carrier aggregation. The first reception signal, the second reception signal and the third reception signal, which are selectively output from the output node 171 of the reception-signal-switching switch 170, are input to the input node 41 of the low-noise amplifier 40. The low-noise amplifier 40 low-noise amplifies the first reception signal, the second reception signal and the third reception signal input to the input node 41 thereof, and outputs the amplified reception signals from the output node 42 thereof. The first reception signal, the second reception signal and the third reception signal output from the output node 42 of the low-noise amplifier 40 are demodulated into baseband signals.

The antenna switch 90 includes: the node 91 that is connected to the antenna 20; the node 92 that is connected to the common node 111 of the duplexer 110 and the common node 121 of the duplexer 120; and the node 93 that is connected to the common node 131 of the duplexer 130. The antenna switch 90 selectively establishes paths for the first transmission signal, the second transmission signal, the first reception signal and the second reception signal between the nodes 91 and 92, and selectively establishes paths for the third transmission signal and the third reception signal between the nodes 91 and 93.

The matching network (MN) 70 matches impedances between the output node 32 of the power amplifier 30 and the input node 161 of the transmission-signal-switching switch 160. The matching network (MN) 80 matches impedances between the input node 41 of the low-noise amplifier 40 and the output node 171 of the reception-signal-switching switch 170.

The transmission/reception module 100 is configured to be able to simultaneously receive the first reception signal and the second reception signal through carrier aggregation. Therefore, the first reception signal and the second reception signal are simultaneously input to the common node 111 of the duplexer 110 from the node 92 of the antenna switch 90. In addition, the first reception signal and the second reception signal are simultaneously input to the common node 121 of the duplexer 120 from the node 92 of the antenna switch 90.

An input node 141 (first input node) of the phase-shift circuit 140 is connected to the reception node 113 of the duplexer 110. An output node 142 (first output node) of the phase-shift circuit 140 is connected to the input node 41 of the low-noise amplifier 40 via the reception-signal-switching switch 170 and the matching network 80. The phase-shift circuit 140 adjusts the impedance at the output node 142 thereof with respect to the first reception signal such that the impedance with respect to the first reception signal is equal to a matching impedance. At this time, the phase-shift circuit 140 adjusts the impedance at the output node 142 thereof with respect to the second reception signal such that the impedance with respect to the second reception signal is equal to an open impedance or a short-circuit impedance. Thus, at the output node 142 of the phase-shift circuit 140, the reflection coefficient of the first reception signal is 0 and the reflection coefficient of the second reception signal is ±1. Therefore, the first reception signal is input to the input node 41 of the low-noise amplifier 40 via the phase-shift circuit 140, whereas the second reception signal that passes through the reception filter 115 is reflected by the output node 142.

Here, when the isolation characteristics of the duplexer 110 are not sufficient, a signal component of the first transmission signal that passes through the transmission filter 114 may pass through the reception filter 115 without necessarily being sufficiently attenuated. Similarly, when the isolation characteristics of the duplexer 120 are not sufficient, a signal component of the second transmission signal that passes through the transmission filter 124 may pass through the reception filter 115 without necessarily being sufficiently attenuated. In light of these circumstances, the phase-shift circuit 140 adjusts the impedance with respect to the first transmission signal, the first reception signal and the second transmission signal at the output node 142 thereof such that the gains of the first transmission signal and the second transmission signal are smaller than the gain of the first reception signal. The method of adjusting the impedance with respect to the first transmission signal, the first reception signal and the second transmission signal using the phase-shift circuit 140 such that the gains of the first transmission signal and the second transmission signal are smaller than the gain of the first reception signal is the same as the method described in embodiment 1. The phase-shift circuit 140 would be ideally designed such that the gain of the first reception signal is maximum and the gains of the first transmission signal and the second transmission signal are minimum at the output node 142 of the phase-shift circuit 140. In the case where it is difficult to realize such a design, it is sufficient to design the phase-shift circuit 140 such that the gains of the first transmission signal and the second transmission signal are smaller than the gain of the first reception signal. For example, a slight reduction in the gain of the first reception signal can be permitted provided that the gains of the first transmission signal and the second transmission signal can be sufficiently reduced from the region of the Smith chart where the gain is high. The phase-shift circuit 140 can be formed of a combination of capacitor elements and inductor elements, and the specific circuit configuration thereof may be the same as any of the example circuit configurations illustrated in FIGS. 8 to 12, for example. The duplexer 110 and the phase-shift circuit 140 do not need to be formed separately from each other, and the phase-shift circuit 140 may be built into the duplexer 110.

An input node 151 (second input node) of the phase-shift circuit 150 is connected to the reception node 123 of the duplexer 120. An output node 152 (second output node) of the phase-shift circuit 150 is connected to the input node 41 of the low-noise amplifier 40 via the reception-signal-switching switch 170 and the matching network 80. The phase-shift circuit 150 adjusts the impedance at the output node 152 thereof with respect to the first reception signal such that the impedance with respect to the first reception signal is equal to an open impedance or a short-circuit impedance. At this time, the phase-shift circuit 150 adjusts the impedance at the output node 152 thereof with respect to the second reception signal such that the impedance with respect to the second reception signal is equal to a matching impedance. Thus, at the output node 152 of the phase-shift circuit 150, the reflection coefficient of the first reception signal is ±1 and the reflection coefficient of the second reception signal is 0. Therefore, the second reception signal is input to the input node 41 of the low-noise amplifier 40 via the phase-shift circuit 150, whereas the first reception signal that passes through the reception filter 125 is reflected by the output node 152.

Here, when the isolation characteristics of the duplexer 120 are not sufficient, a signal component of the second transmission signal that passes through the transmission filter 124 may pass through the reception filter 125 without necessarily being sufficiently attenuated. Similarly, when the isolation characteristics of the duplexer 110 are not sufficient, a signal component of the first transmission signal that passes through the transmission filter 114 may pass through the reception filter 125 without necessarily being sufficiently attenuated. In light of these circumstances, the phase-shift circuit 150 adjusts the impedance with respect to the first transmission signal, the second transmission signal and the second reception signal at the output node 152 thereof such that the gains of the first transmission signal and the second transmission signal are smaller than the gain of the second reception signal. The method of adjusting the impedance with respect to the first transmission signal, the second transmission signal and the second reception signal using the phase-shift circuit 150 such that the gains of the first transmission signal and the second transmission signal are smaller than the gain of the second reception signal is the same as the method described in embodiment 1. The phase-shift circuit 150 would be ideally designed such that the gain of the second reception signal is maximum and the gains of the first transmission signal and the second transmission signal are minimum at the output node 152 of the phase-shift circuit 150. In the case where it is difficult to realize such a design, it is sufficient to design the phase-shift circuit 150 such that the gains of the first transmission signal and the second transmission signal are smaller than the gain of the second reception signal. For example, a slight reduction in the gain of the second reception signal can be permitted provided that the gains of the first transmission signal and the second transmission signal can be sufficiently reduced from the region of the Smith chart where the gain is high. The phase-shift circuit 150 can be formed of a combination of capacitor elements and inductor elements, and the specific circuit configuration thereof may be the same as any of the example circuit configurations illustrated in FIGS. 8 to 12, for example. The duplexer 120 and the phase-shift circuit 150 do not need to be formed separately from each other, and the phase-shift circuit 150 may be built into the duplexer 120.

As indicated by symbol 501, the reception filter 115 and the phase-shift circuit 140 may be packaged as a single discrete component. In addition, as indicated by symbol 502, the reception filter 125 and the phase-shift circuit 150 may be packaged as a single discrete component. Alternatively, as indicated by symbol 503, the duplexers 110, 120 and 130 and the phase-shift circuits 140 and 150 may be packaged as a single discrete component. By adopting such packaging, changes in the frequency characteristics of impedance caused by the positional relationship between components (layout) can be suppressed. A dual in-line package, a single in-line package, a zig-zag in-line package or a pin grid array may be used for such packaging, for example.

Thus, the transmission/reception module 100 according to embodiment 2 can realize improved isolation characteristics, and can simultaneously receive the first reception signal and the second reception signal via carrier aggregation. In addition, changes in the frequency characteristics of impedance caused by the positional relationship between components can be suppressed by packaging the reception filter 115 and the phase-shift circuit 140 as a single discrete component. This effect can also be obtained by packaging the reception filter 125 and the phase-shift circuit 150 as a single discrete component. The same effect can also be obtained by packaging the duplexers 110, 120 and 130, and the phase-shift circuits 140 and 150 as a single discrete component.

The purpose of the embodiments described above is to enable easy understanding of the present disclosure, and the embodiments are not to be interpreted as limiting the present disclosure. The present disclosure can be changed or improved without departing from the gist of the disclosure, and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. For example, "a circuit element A is connected to a circuit element B" does not only refer to a case where the circuit element A is directly connected to the circuit element B, but also includes a case in which a signal path is established between the circuit element A and the circuit element B via a circuit element C. Furthermore, positional relationships in terms of directions such as above, below, left and right are not limited to the depicted proportions unless otherwise stated. In addition, the elements included in the embodiments can be combined as much as technically possible and such combined elements are also included in the scope of the present disclosure so long as the combined elements have the characteristics of the present disclosure.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A transmission/reception module comprising:
    a first duplexer that has a first common node, a first transmission node, and a first reception node, a first transmission signal being provided from the first transmission node to the first common node and a first reception signal being provided from the first common node to the first reception node;
    a second duplexer that has a second common node electrically connected to the first common node, a second transmission node, and a second reception node, a second transmission signal being provided from the second transmission node to the second common node and a second reception signal being provided from the second common node to the second reception node;
    a first phase-shift circuit that has a first input node electrically connected to the first reception node and a first output node electrically connected to an input node of a low-noise amplifier, wherein at the first output node, gains of the first transmission signal and the second transmission signal are smaller than a gain of the first reception signal; and
    a second phase-shift circuit that has a second input node electrically connected to the second reception node and a second output node electrically connected to the input node of the low-noise amplifier, wherein at the second output node, gains of the first transmission signal and the second transmission signal are smaller than a gain of the second reception signal.

2. The transmission/reception module according to claim 1, wherein the transmission/reception module is configured to simultaneously receive the first reception signal and the second reception signal through carrier aggregation.

3. The transmission/reception module according to claim 2, further comprising:
    a power amplifier configured to amplify the first transmission signal and the second transmission signal.

4. The transmission/reception module according to claim 2, further comprising:
    the low-noise amplifier configured to amplify the first reception signal and the second reception signal.

5. The transmission/reception module according to claim 1, wherein:
    the first duplexer comprises a first reception filter, a frequency band of the first reception signal being within a pass band of the first reception filter, and
    the first reception filter and first phase-shift circuit are packaged as a single component.

6. The transmission/reception module according to claim 1, wherein:
    the second duplexer comprises a second reception filter, a frequency band of the second reception signal being within a pass band of the second reception filter, and the second reception filter and second phase-shift circuit are packaged as a single component.

7. The transmission/reception module according to claim 1, wherein the first duplexer, the second duplexer, the first phase-shift circuit, and the second phase-shift circuit are packaged as a single component.

8. The transmission/reception module according to claim 1, wherein the first phase-shift circuit is further configured as a matching network configured to perform impedance matching between the input node of the low-noise amplifier and the first reception node of the first duplexer.

9. The transmission/reception module according to claim 1, wherein the first phase-shift circuit comprises a capacitor connected in a signal path between two terminals of the first phase-shift circuit, and an inductor shunt connected between the signal path and ground.

10. The transmission/reception module according to claim 1, wherein the first phase-shift circuit comprises an inductor connected in a signal path between two terminals of the first phase-shift circuit, a first capacitor shunt connected between the signal path at a first end of the inductor and ground, and a second capacitor shunt connected between the signal path at a second end of the inductor and ground.

11. The transmission/reception module according to claim 1, wherein the first phase-shift circuit comprises a capacitor connected in a signal path between two terminals of the first phase-shift circuit, a first inductor shunt connected between the signal path at a first end of the capacitor and ground, and a second inductor shunt connected between the signal path at a second end of the capacitor and ground.

12. The transmission/reception module according to claim 1, wherein the first phase-shift circuit comprises first and second inductors connected in series in a signal path between two terminals of the first phase-shift circuit, and a capacitor shunt connected between the signal path at a node between the first and second inductors, and ground.

13. The transmission/reception module according to claim 1, wherein the first phase-shift circuit comprises first and second capacitors connected in series in a signal path between two terminals of the first phase-shift circuit, and an inductor shunt connected between the signal path at a node between the first and second capacitors, and ground.

14. The transmission/reception module according to claim 2, wherein the first phase-shift circuit is further configured to adjust the impedance at the first output node with respect to the first transmission signal, the first reception signal, and the second transmission signal such that the impedance with respect to the first reception signal is equal to a matching impedance, and the impedance with respect to the second reception signal is equal to an open impedance or short-circuit impedance.

15. The transmission/reception module according to claim 3, wherein the second phase-shift circuit is further configured to adjust the impedance at the second output node with respect to the first transmission signal, the second transmission signal, and the second reception signal such that the impedance with respect to the first reception signal is equal to an open impedance or short-circuit impedance, the impedance with respect to the second reception signal is equal to a matching impedance, and gains of the first transmission signal and the second transmission signal are smaller than a gain of the second reception signal.

* * * * *